(12) United States Patent
Cheng et al.

(10) Patent No.: US 10,147,635 B2
(45) Date of Patent: Dec. 4, 2018

(54) DIFFERENT SHALLOW TRENCH ISOLATION FILL IN FIN AND NON-FIN REGIONS OF FINFET

(71) Applicant: International Business Machines Corporation, Armonk, NY (US)

(72) Inventors: Kangguo Cheng, Schenectady, NY (US); Peng Xu, Guilderland, NY (US); Chen Zhang, Guilderland, NY (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 13 days.

(21) Appl. No.: 15/431,970

(22) Filed: Feb. 14, 2017

(65) Prior Publication Data

US 2018/0102277 A1 Apr. 12, 2018

Related U.S. Application Data

(62) Division of application No. 15/289,258, filed on Oct. 10, 2016, now Pat. No. 9,704,994.

(51) Int. Cl.
*H01L 21/31* (2006.01)
*H01L 21/762* (2006.01)
(Continued)

(52) U.S. Cl.
CPC .... *H01L 21/76224* (2013.01); *H01L 21/0217* (2013.01); *H01L 21/02126* (2013.01);
(Continued)

(58) Field of Classification Search
CPC ........... H01L 21/02126; H01L 21/0217; H01L 21/30604; H01L 21/31111; H01L 21/31144; H01L 27/0886; H01L 29/785; H01L 29/0649; H01L 29/518; H01L 29/66795
See application file for complete search history.

(56) References Cited

U.S. PATENT DOCUMENTS 9,484,255 B1\* 11/2016 Niimi ................ H01L 21/76879
2010/0193870 A1\* 8/2010 Ho ................... H01L 21/823807
257/365

(Continued)

OTHER PUBLICATIONS

List of IBM Patents or Patent Applications Treated as Related; (Appendix P), Filed Feb. 14, 2017; 2 pages.
Kangguo Cheng et al., "Different Shallow Trench Isolation Fill in Fin and Non-Fin Regions of Finfet", U.S. Appl. No. 15/289,258, filed Oct. 10, 2016.

*Primary Examiner* — Joseph Galvin, III
(74) *Attorney, Agent, or Firm* — Cantor Colburn LLP; Vazken Alexanian

(57) ABSTRACT

A fin field effect transistor (finFET) and a method of fabricating the finFET. The method includes forming one or more fins above a substrate in a channel region, depositing a first insulating material conformally on the one or more fins and the substrate, and depositing a second insulating material over the first insulating material in non-channel regions adjacent to the channel region. A selective etch of the first insulating material in the channel region is performed to form a trench. The trench is filled with the second insulating material. The second insulating material in the channel region is adjacent to the first insulating material in the non-channel regions.

13 Claims, 18 Drawing Sheets

(51) Int. Cl.
  *H01L 29/78*   (2006.01)
  *H01L 29/66*   (2006.01)
  *H01L 21/311*  (2006.01)
  *H01L 21/306*  (2006.01)
  *H01L 29/06*   (2006.01)
  *H01L 29/51*   (2006.01)
  *H01L 27/088*  (2006.01)
  *H01L 21/02*   (2006.01)

(52) U.S. Cl.
  CPC .. *H01L 21/30604* (2013.01); *H01L 21/31111* (2013.01); *H01L 21/31144* (2013.01); *H01L 27/0886* (2013.01); *H01L 29/0649* (2013.01); *H01L 29/518* (2013.01); *H01L 29/66545* (2013.01); *H01L 29/66795* (2013.01); *H01L 29/785* (2013.01)

(56) References Cited

U.S. PATENT DOCUMENTS

| | | | |
|---|---|---|---|
| 2011/0095372 A1* | 4/2011 | Yuan | H01L 21/76229 257/368 |
| 2012/0025328 A1* | 2/2012 | Luo | H01L 21/823425 257/411 |
| 2016/0204193 A1* | 7/2016 | Hattendorf | H01L 29/66795 257/393 |
| 2017/0194422 A1* | 7/2017 | Tung | H01L 21/02532 |

* cited by examiner

DIFFERENT SHALLOW TRENCH ISOLATION FILL IN FIN AND NON-FIN REGIONS OF FINFET

DOMESTIC BENEFIT/NATIONAL STAGE INFORMATION

This application is a division of U.S. application Ser. No. 15/289,258 filed Oct. 10, 2016, the disclosure of which is incorporated herein by reference in its entirety.

BACKGROUND

The present invention relates to fin field effect transistor (finFET) fabrication, and more specifically, to the use of different shallow trench isolation (STI) fill in the fin and non-fin regions of the finFET.

FinFETs are transistors in which the channel regions between the source and drain regions are formed as fins, and gates are formed over the fins. During the fabrication process, gates are formed in both the fin region, where they are retained, and in the non-fin region, where they are ultimately removed. The formation of the dummy gates in the non-fin region facilitates structural control because the gates have much greater height relative to width. Generally, the same oxide is formed between the fins in the fin region and also in the non-fin region. This oxide can affect the structural integrity of the gates.

SUMMARY

According to an embodiment of the present invention, a method of fabricating a fin field effect transistor (finFET) includes forming one or more fins above a substrate in a channel region; depositing a first insulating material conformally on the one or more fins and the substrate, and depositing a second insulating material over the first insulating material in non-channel regions adjacent to the channel region. A selective etch of the first insulating material in the channel region is performed to form a trench, and the trench is filled with the second insulating material. The second insulating material in the channel region is adjacent to the first insulating material in the non-channel regions.

According to another embodiment, a fin field effect transistor (finFET) includes one or more fins forming a channel region above a substrate, and a first insulating material formed in non-channel regions adjacent to the channel region. A second insulating material, different than the first insulating material, is formed in the channel region directly below the one or more fins.

BRIEF DESCRIPTION OF THE DRAWINGS

The subject matter which is regarded as the invention is particularly pointed out and distinctly claimed in the claims at the conclusion of the specification. The forgoing and other features, and advantages of the invention are apparent from the following detailed description taken in conjunction with the accompanying drawings in which:

FIGS. 1-8 show cross-sectional views of intermediate structures that are formed in the process of fabricating a finFET according to one or more embodiments, in which:

FIG. 1 is a cross-sectional view showing a fin hardmask deposited on a substrate;

FIG. 2 shows the result of patterning the hardmask shown in FIG. 1;

FIG. 3 is the intermediate structure that results from forming a mask 310 over the hardmask in the fin region;

FIG. 4 shows the result of removing the hardmask in the non-fin region, which is not covered by the mask;

FIG. 5 is a cross-sectional view of an intermediate structure resulting from removal of the mask over the hardmask remaining in the fin region;

FIG. 6 shows the fins that result from a fin etch process performed on the intermediate structure shown in FIG. 6;

FIG. 7 is the intermediate structure that results from conformal deposition of a first insulating material on the structure shown in FIG. 6; and FIG. 8 results from the deposition of a second insulating material over the first insulating material in the non-fin regions;

FIGS. 9-12 show cross-sectional views of intermediate structures involved in fabricating a finFET according to an embodiment, in which:

FIG. 9 is the intermediate structure that results from a selective etch of the first insulating material in the fin region of the structure shown in FIG. 8;

FIG. 10 is a cross-sectional view of the intermediate structure that results from deposition of the second insulating material in the trench shown in FIG. 9;

FIG. 11 results from a selective etch of the second insulating material to the height of the first insulating material; and FIG. 12 is the intermediate structure that results from removal of the hardmask above the fins and indicates the channel height;

FIGS. 13-16 show cross-sectional views of intermediate structures involved in fabricating a finFET according to another embodiment, in which:

FIG. 13 is the intermediate structure that results from a selective etch of all of the first insulating material in the fin region of the structure shown in FIG. 8;

FIG. 14 is a cross-sectional view of the intermediate structure that results from deposition of the second insulating material in the trench shown in FIG. 13;

FIG. 15 results from a selective etch of the second insulating material to the height of the first insulating material; and FIG. 16 is the intermediate structure that results from removal of the hardmask above the fins and indicates the channel height;

DETAILED DESCRIPTION

As previously noted, finFET fabrication can include the formation of dummy gates in the non-fin region for structural control, in addition to the formation of gates in the fin region. Subsequent processing of the finFET requires the use of hydrogen fluoride (HF). This can undercut the oxide that is typically formed in the fin and non-fin regions, but because the dummy gates are not anchored by fins, the undercut can cause flop-over of the dummy gates. In addition, in the fin region, control of the oxide recess during the fin reveal process can be challenging. The level to which the oxide is recessed determines the fin reveal or channel height.

In order to provide a uniform and well-controlled channel height, it is a necessary during finFET fabrication to control of the oxide recess.

Turning now to an overview of aspects of the present invention, one or more embodiments relate to using a different insulating material as the STI fill in the non-fin regions than the material used instead or additionally in the fin region. The insulating material in the non-fin region facilitates control of the oxide recess and, thus, control of the channel height. Specifically, the height of the insulating material in the non-fin region is used to control the depth of the STI fill recess in the fin region. That is, the insulating material in the non-fin regions acts as an endpoint detection layer during the process of recessing the STI fill in the fin region. Additionally, when the insulating material in the non-fin regions is not an oxide, flop over of the dummy gate can be prevented, because the previously discussed oxide undercut is avoided.

Figure 1:
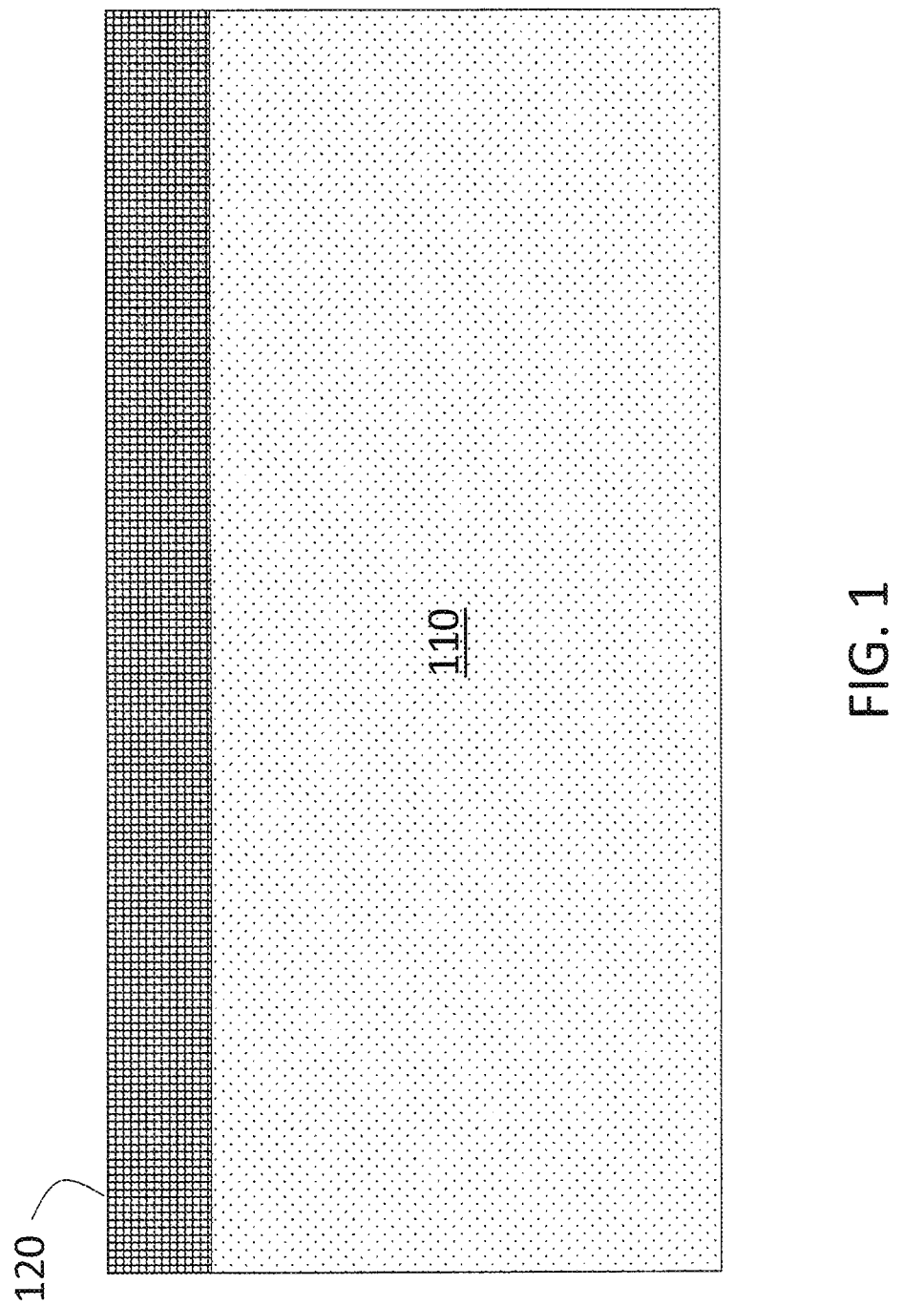

Turning now to a more detailed description of one or more embodiments, FIGS. 1-7 show cross-sectional views of intermediate structures that are formed in the process of fabricating a finFET. FIG. 1 is a cross-sectional view showing a fin hardmask 120 deposited on a substrate 110. The fin hardmask 120 is silicon nitride (SiN), for example.

The substrate 110 can include a bulk semiconductor, such as silicon, germanium, silicon germanium, silicon carbide, and those consisting essentially of III-V compound semiconductors having a composition defined by the formula $Al_{X1}Ga_{X2}In_{X3}As_{Y1}P_{Y2}N_{Y3}Sb_{Y4}$, where X1, X2, X3, Y1, Y2, Y3, and Y4 represent relative proportions, each greater than or equal to zero and X1+X2+X3+Y1+Y2+Y3+Y4=1 (1 being the total relative mole quantity). Other suitable substrates 110 include II-VI compound semiconductors having a composition $Zn_{A1}Cd_{A2}Se_{B1}Te_{B2}$, where A1, A2, B1, and B2 are relative proportions each greater than or equal to zero and A1+A2+B1+B2=1 (1 being a total mole quantity). The semiconductor substrate 110 can also include an organic semiconductor or a layered semiconductor such as, for example, Si/SiGe, a silicon-on-insulator or a SiGe-on-insulator. A portion or entire semiconductor substrate 110 can be amorphous, polycrystalline, or monocrystalline. In addition to the aforementioned types of semiconductor substrates 110, the semiconductor substrate 110 can also include a hybrid oriented (HOT) semiconductor substrate in which the HOT substrate has surface regions of different crystallographic orientation. The semiconductor substrate 110 can be doped, undoped, or contain doped regions and undoped regions therein. The semiconductor substrate 110 can contain regions with strain and regions without strain therein, or contain regions of tensile strain and compressive strain. In one or more embodiments, the substrate 110 can be a semiconductor-on-insulator (SOI) substrate. The substrate 110 can further include other structures (not shown) such as STI, fins, nanowires, nanosheets, resistors, capacitors, etc. The formation of the intermediate structure shown in FIG. 1 is known and not further detailed herein.

Figure 2:
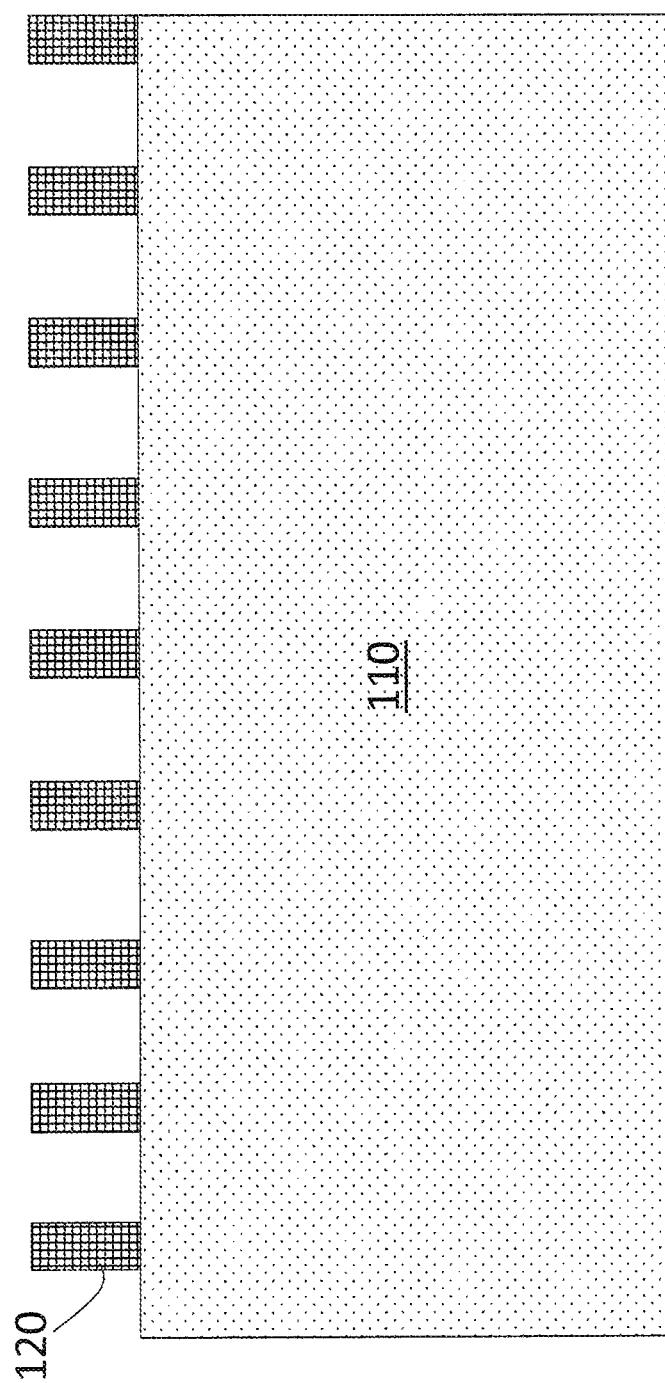
Figure 3:
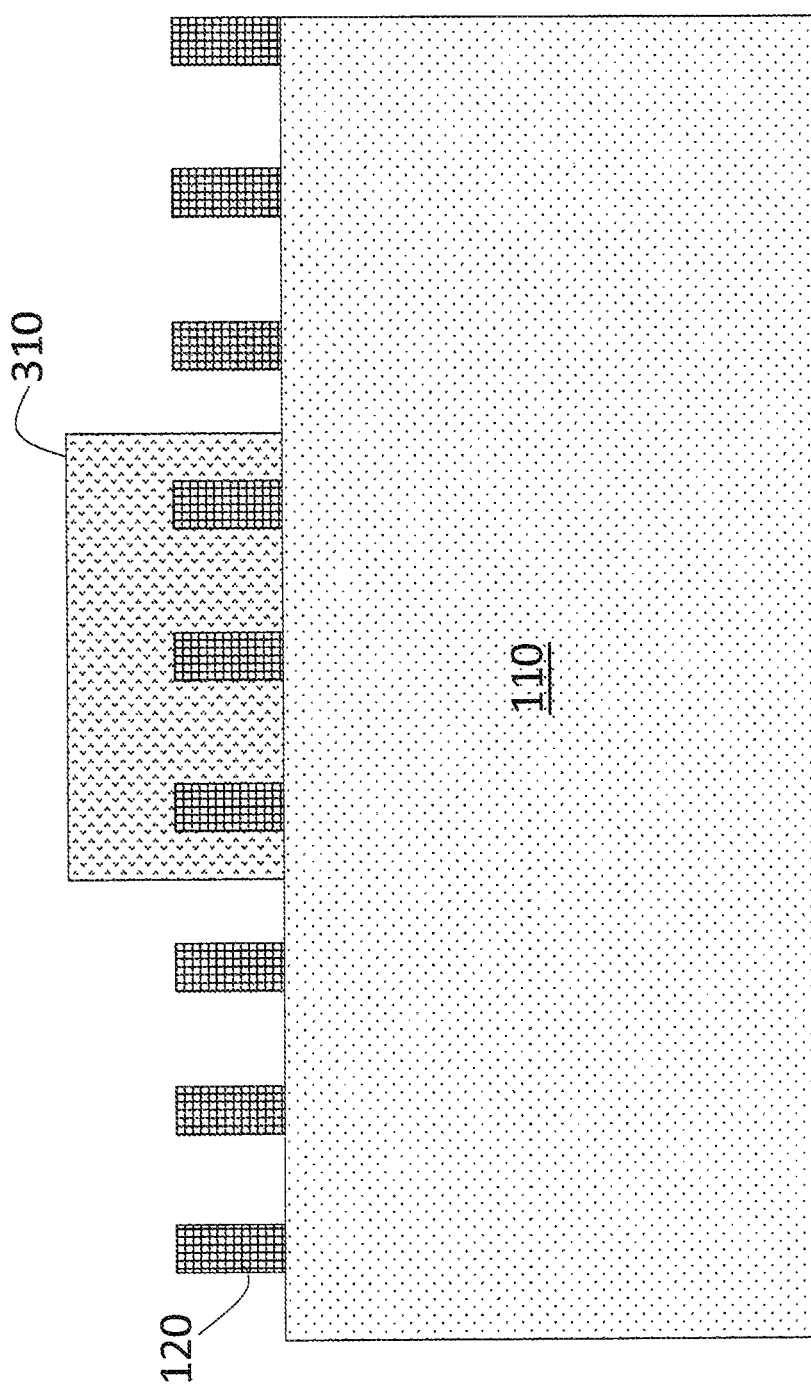
Figure 4:
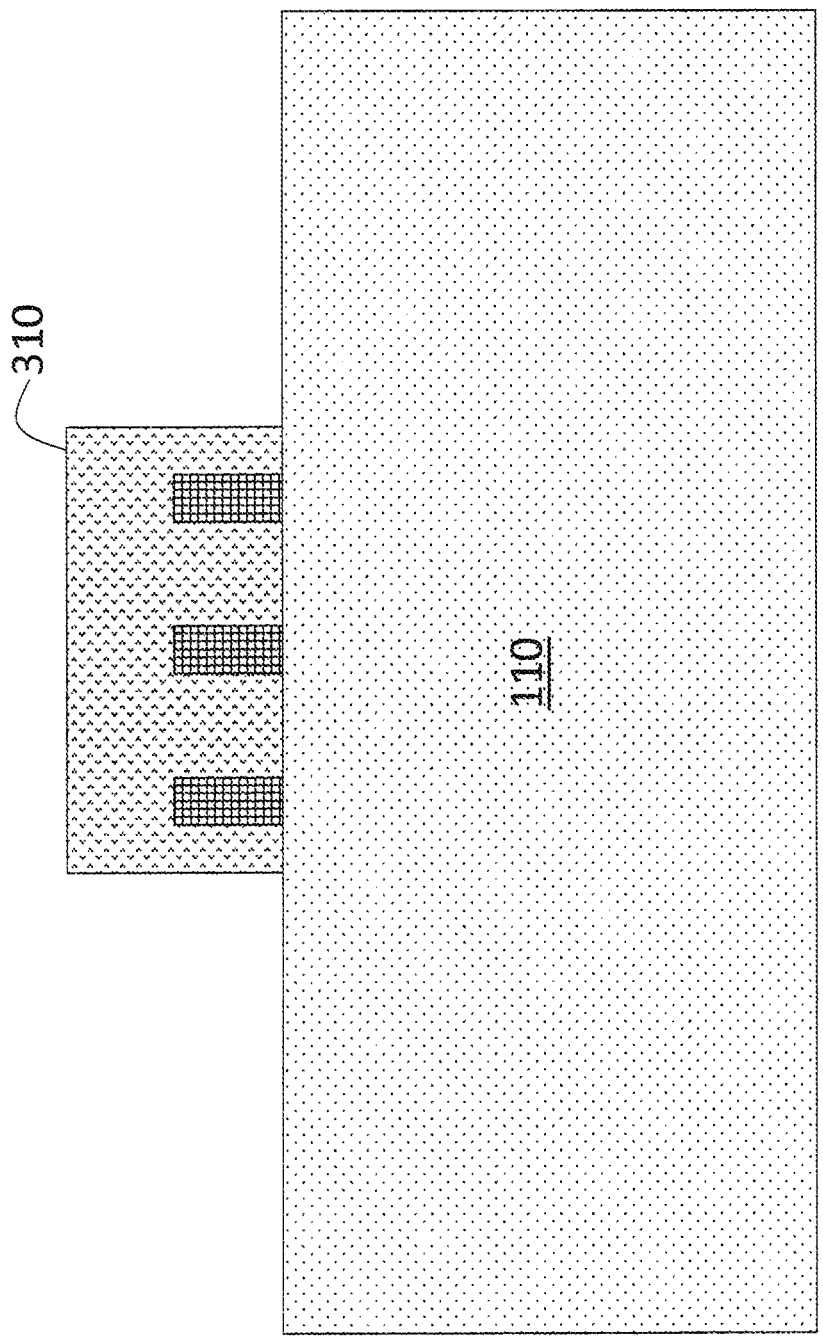

Patterning and etching of the fin hardmask 120 results in the intermediate structure having multiple fin-width hardmasks 120 shown in FIG. 2. The patterning can include a self-aligned double patterning (SADP) or side-wall assisted double patterning (self-aligned quadruple patterning (SAQP)) process. FIG. 3 shows a mask 310 formed over some of the hardmasks 120 shown in FIG. 2. The material of the mask 310 (e.g., SiN) is deposited and patterned to cover only the hardmasks 120 in the fin region, which is where fins will be formed to act as the channel region of the finFET. The hardmasks 120 in the non-fin region are not covered by the mask 310 and are removed to form the intermediate structure shown in FIG. 4.

Figure 5:
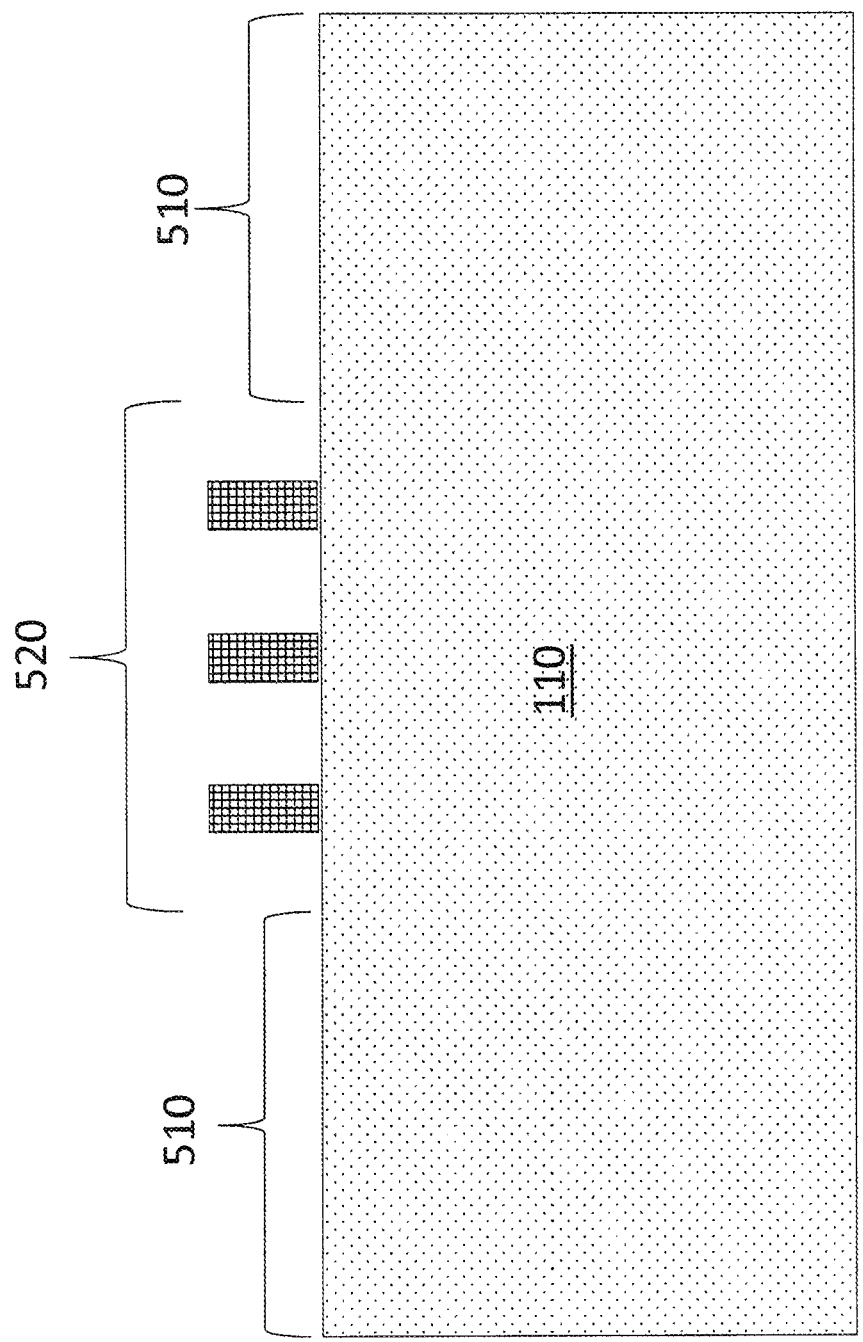

FIG. 5 is a cross-sectional view of an intermediate structure resulting from removal of the mask 310 over the hardmasks 120 in the fin region 520. An isotropic etch can be used to remove the mask 310. The non-fin regions 510 on either side of the fin region 510 are indicated in FIG. 5.

Figure 6:
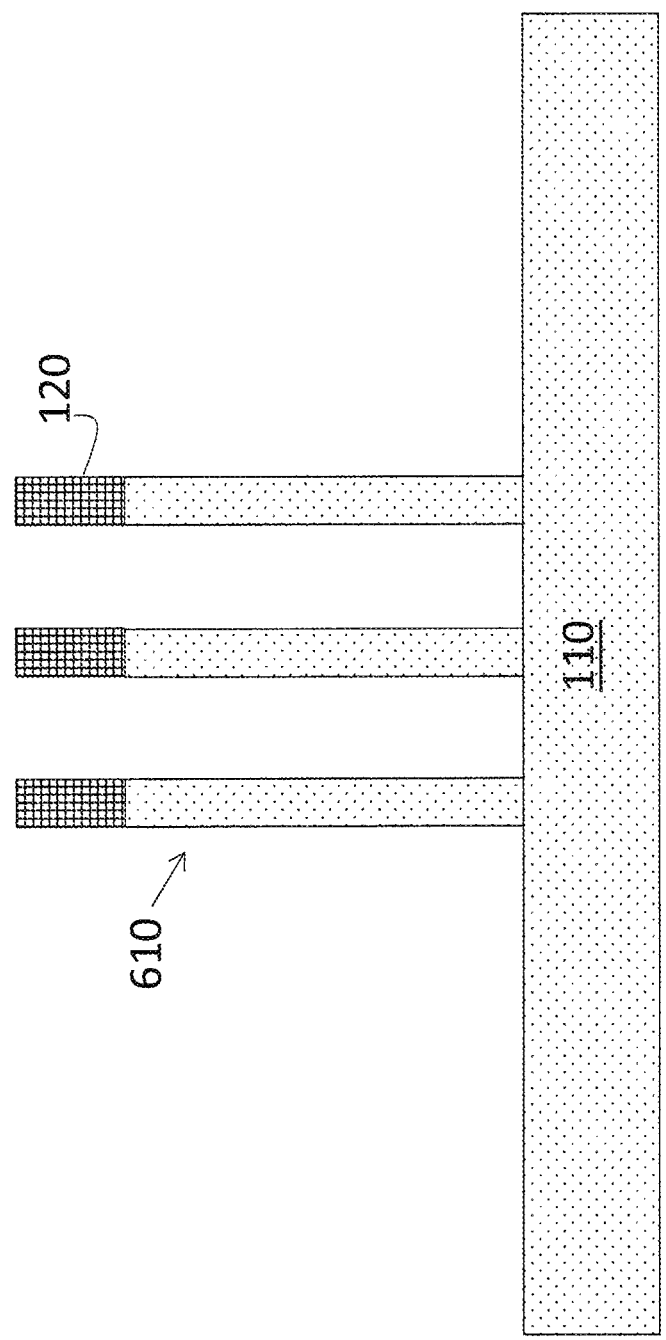
Figure 7:
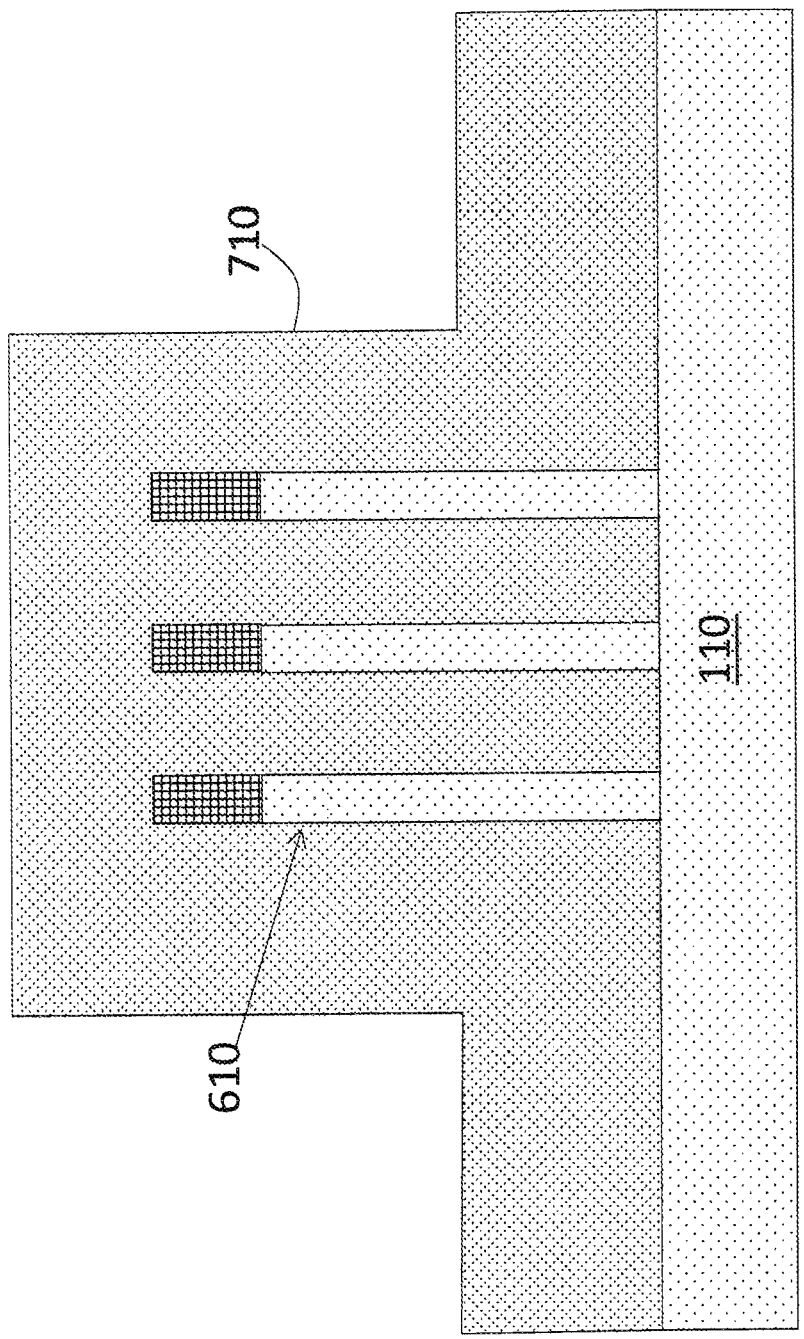
Figure 8:
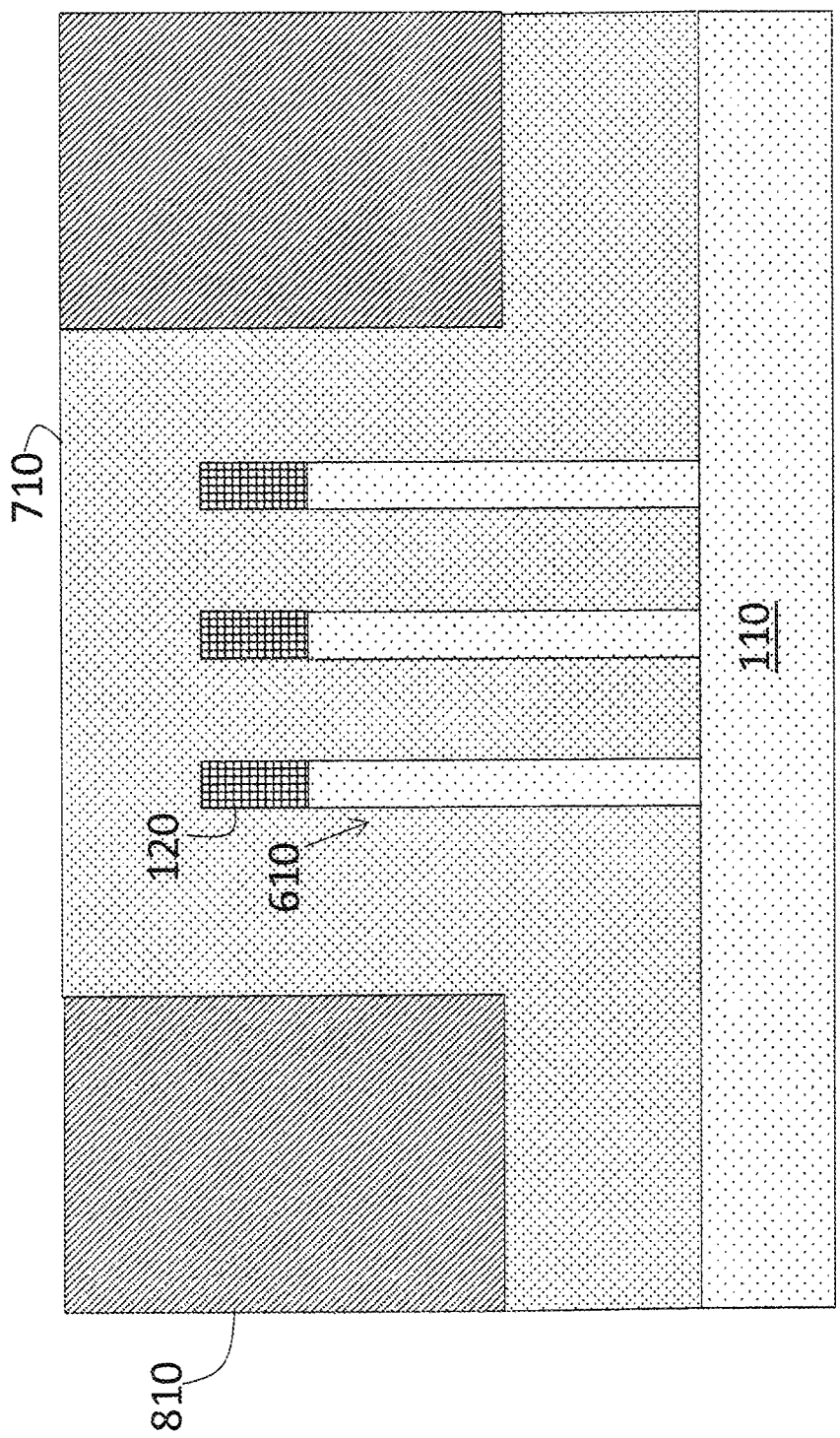

FIG. 6 shows a result of a fin etch process. An isotropic etch such as a reactive ion etch (RIE) process is used to etch the substrate 110 to form fins 610 below the hardmasks 120 that was retained in the fin region 520. FIG. 7 is an intermediate structure that results from conformal deposition of a first insulating material 710. First insulating material 710 is a label used only for explanatory purposes, to distinguish from the second insulating material 810 (FIG. 8) that is a different material according to one or more embodiments. FIG. 8 shows the result of depositing a second insulating material 810 above the first insulating material 710 in the non-fin region 510. The deposition can be followed by a chemical mechanical planarization (CMP) process. According to one exemplary embodiment, the first insulating material 710 is silicon carbon oxygen (SiCO), for example. The second insulating material 810 is any known STI fill material and can be an oxide (e.g., silicon oxide (SiO)). When the second insulating material 810 is not an oxide, the first insulating material 710 can be an oxide. Also, based on the material that is used as the gate spacer in subsequent processing not being the same material, the first insulating material 710 can be silicon boron carbide nitride (SiBCN) or SiN.

Figure 9:
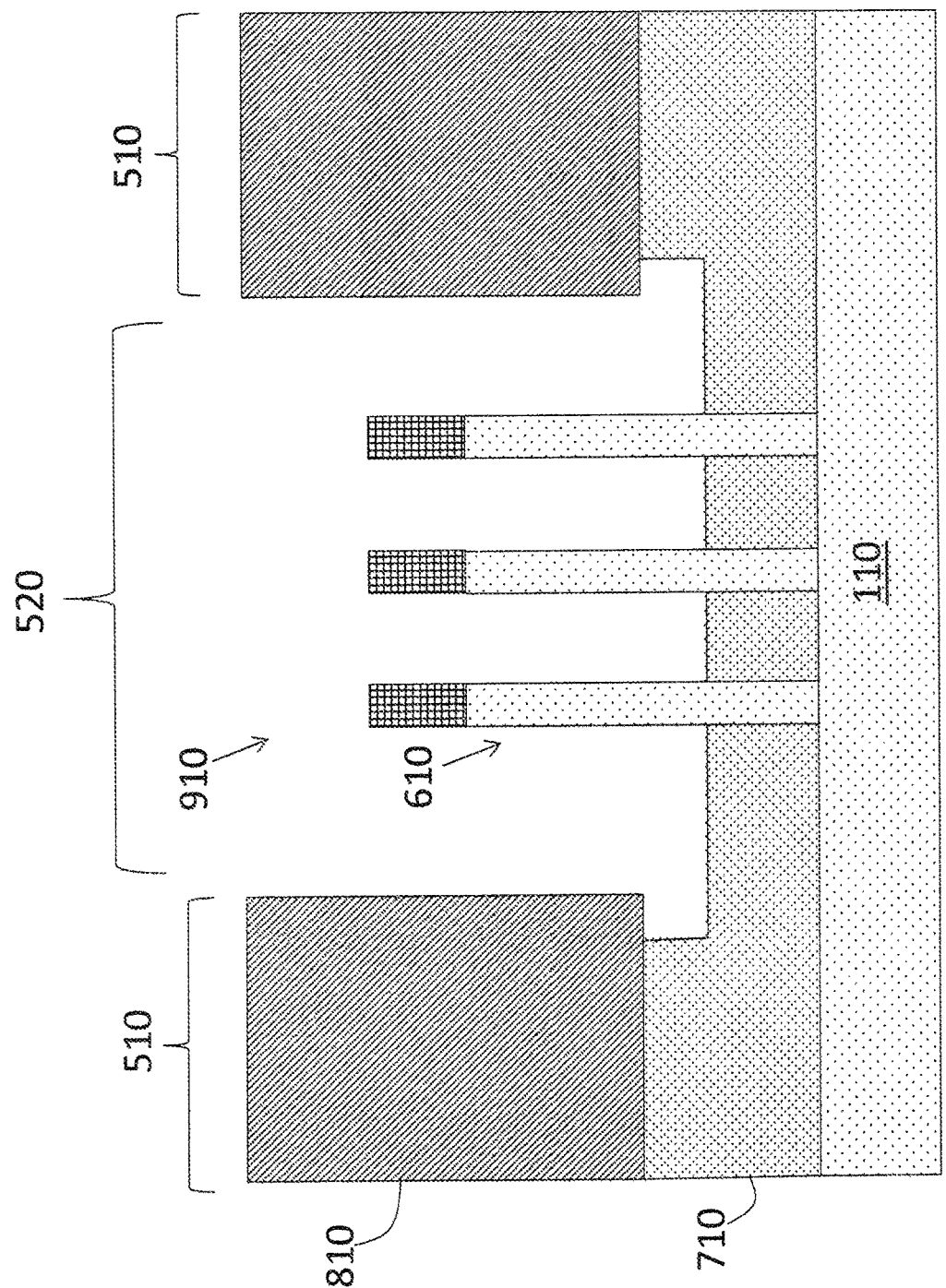

FIGS. 9-12 show cross-sectional views of intermediate structures involved in fabricating a finFET according to an embodiment. A selective etch (e.g., RIE) process is performed to remove most of the first insulating material 710 in the fin region 520 and leave a trench 910, as shown in FIG. 9. According to the exemplary embodiment shown in FIG. 9, an undercut is performed to remove some of the first insulating material 710 below the second insulating material 810 in the non-fin regions 510, as well. However, as FIG. 9 indicates, the original depth of the first insulating material 710 is left intact in at least part of the non-fin regions 510. This first insulating material 710 acts as the endpoint detection layer discussed with reference to FIG. 11. According to alternate embodiments, the first insulating material 710 below the second insulating material 810 in the non-fin regions 510 is not etched.

Figure 10:
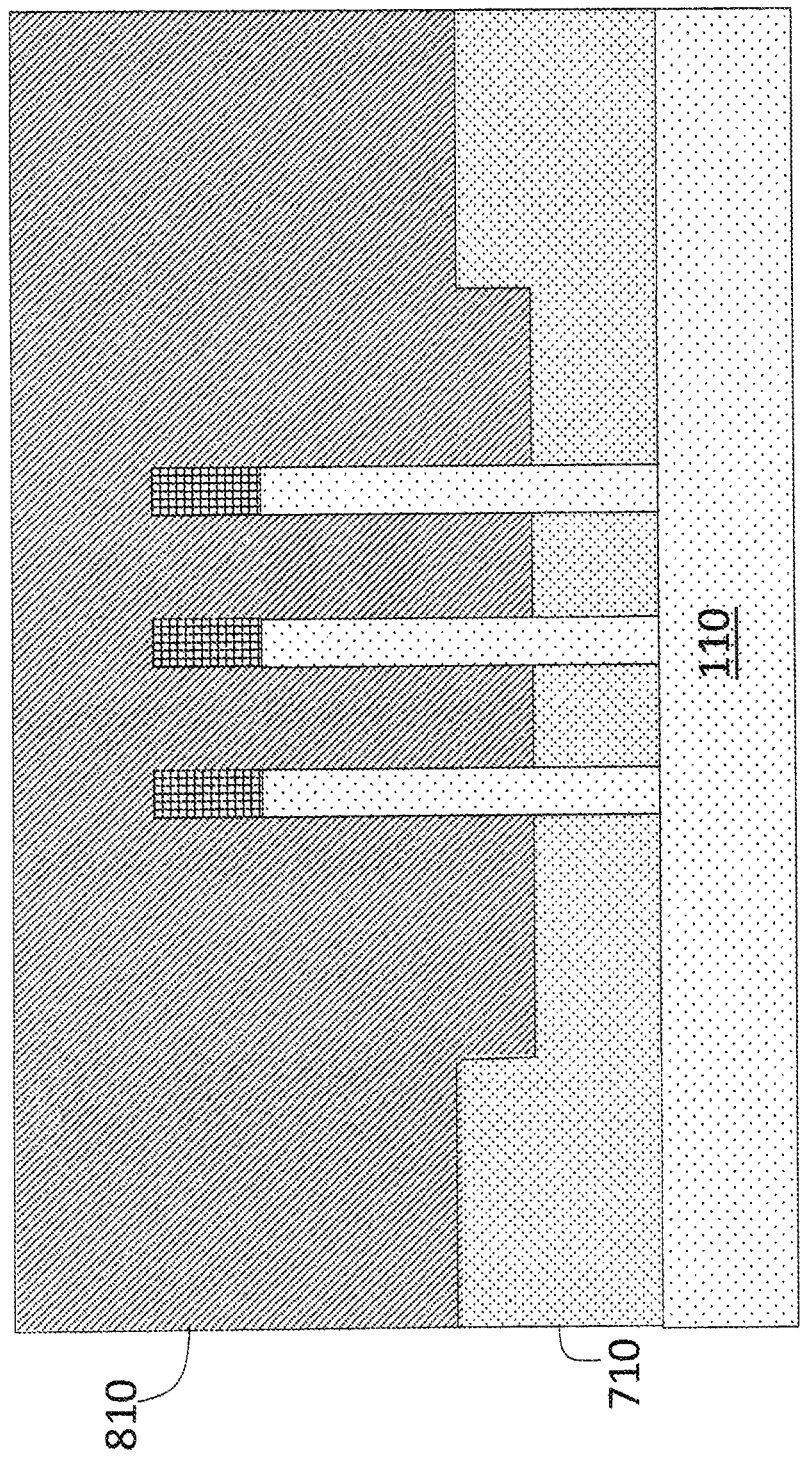
Figure 11:
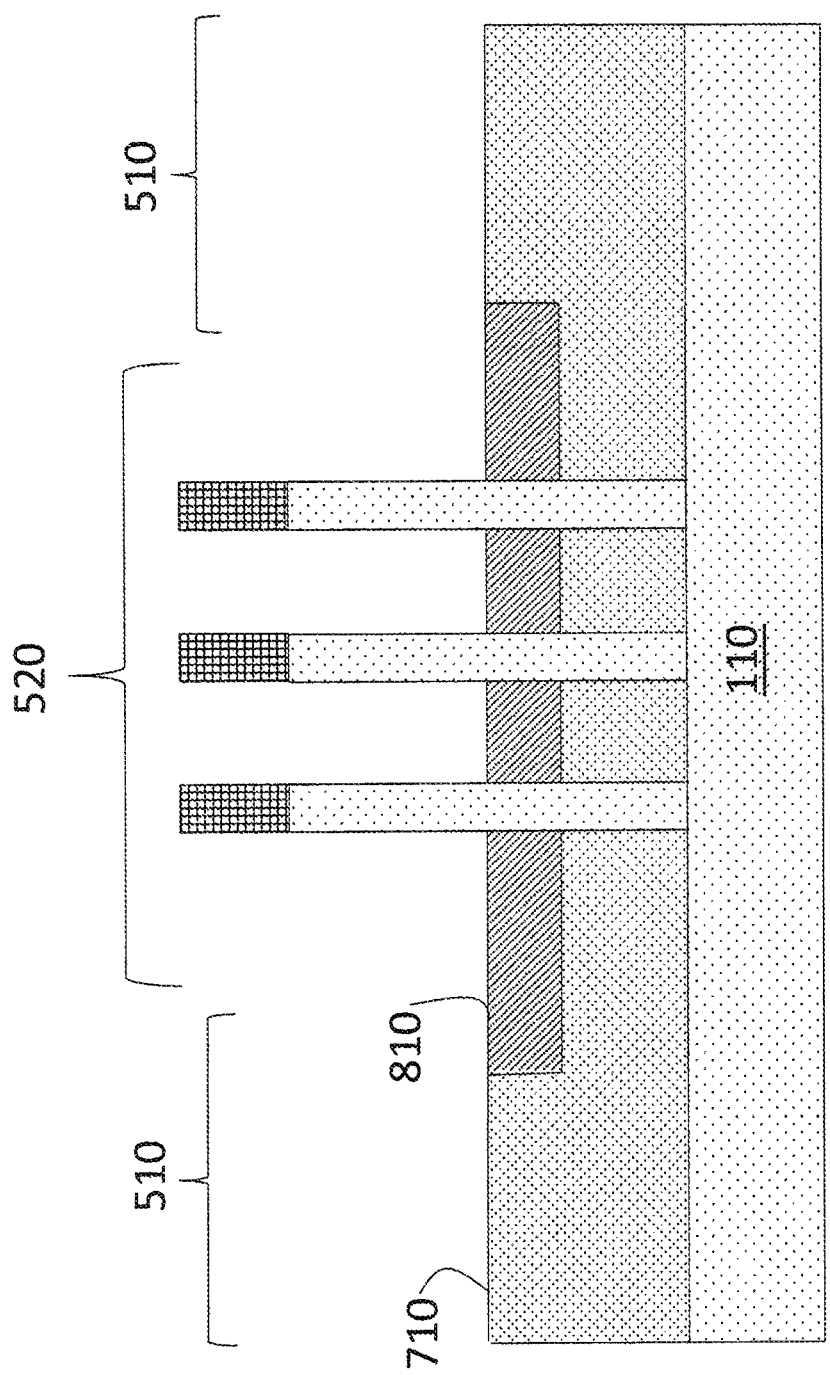
Figure 12:
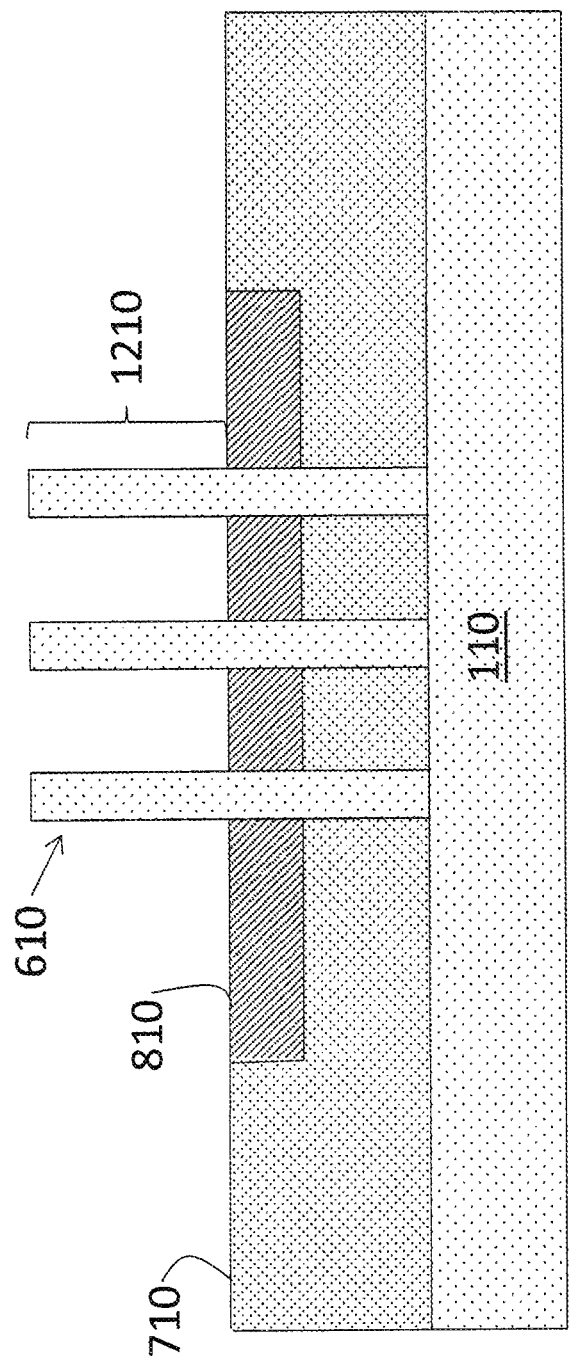

FIG. 10 is a cross-sectional view of the intermediate structure that results from deposition of the second insulting material 810 in the trench 910. A CMP process is performed following the deposition. At this stage, the second insulating material 810 is recessed to provide the intermediate structure shown in FIG. 11. All of the second oxide material 810 in the non-fin region 510 is removed, and the recess of the second insulating material 810 in the fin region 520 is to the height of the first insulating material 710. That is, the first insulating material 710 in the non-fin region 510 is used as a guide or an endpoint detection layer to recess the second insulating layer 810 in the fin region 520. Thus, controlling the height of the first insulating material 710 facilitates controlling the recess of the second insulating material 810. The recess of the second insulating material 810, in turn, defines the height of the fins 610 above the second insulating material 810 or the channel height 1210 (FIG. 12). FIG. 12 shows the intermediate structure of the finFET with the channel height 1210 defined. As FIG. 12 indicates, the hardmask 120 above the fins 610 is removed.

Figure 13:
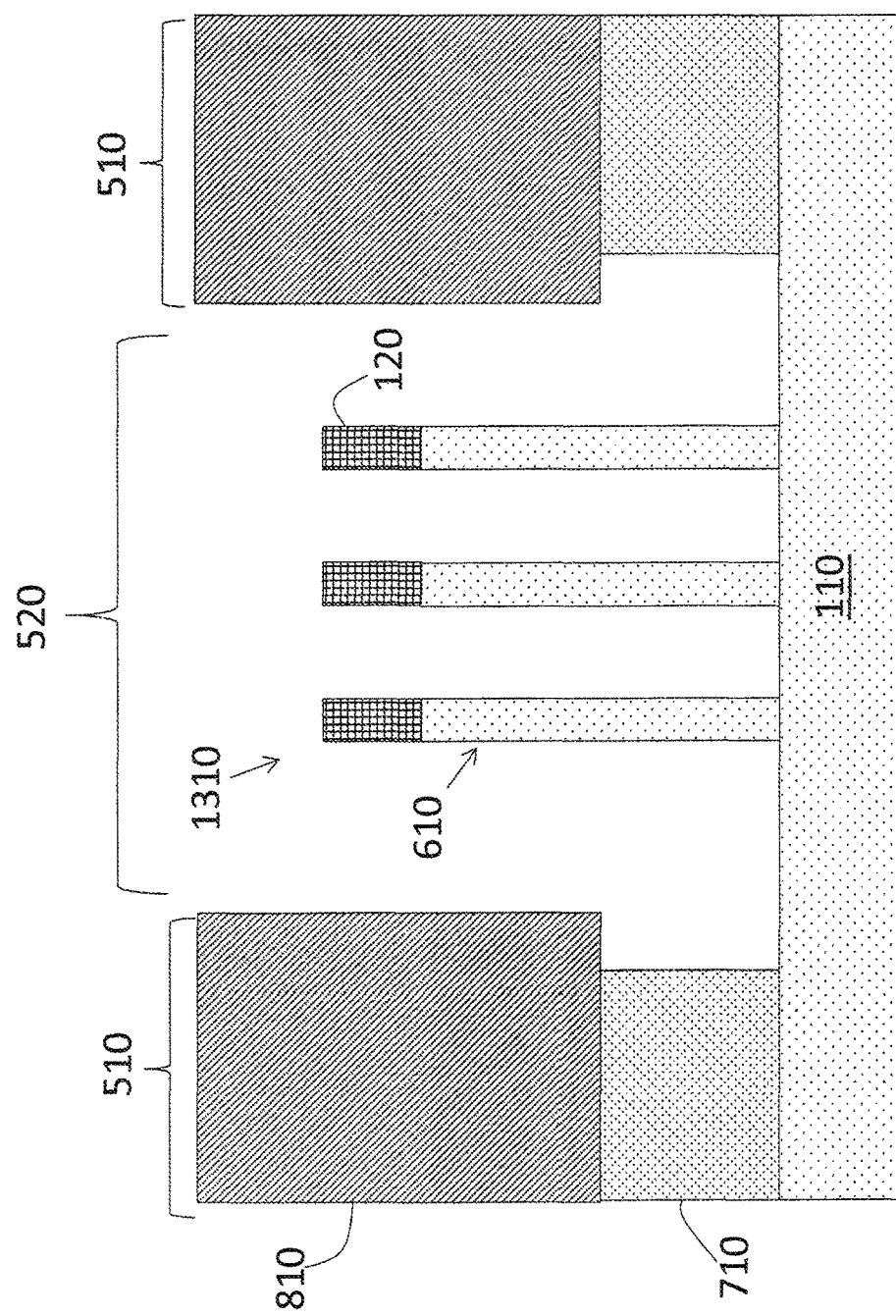

FIGS. 13-16 are cross-sectional views of intermediate structures involved in fabricating a finFET according to another embodiment. FIG. 13 shows the result of a selective etch (e.g., RIE) process to remove the first insulating material 710 in the fin region 520 and leave a trench 1310. In contrast to the embodiment shown in FIG. 9, the embodiment shown in FIG. 13 includes removal of all the first insulating material 710 in the fin region 520. Like the embodiment shown in FIG. 9, the embodiment shown in FIG. 13 does include the undercut of first insulating material 710 under the second insulating material 810 in the non-fin regions 510. As previously noted, the first insulating material 710 below the second insulating material 810 in the non-fin regions 510 can be left completely intact in alternate embodiments.

Figure 14:
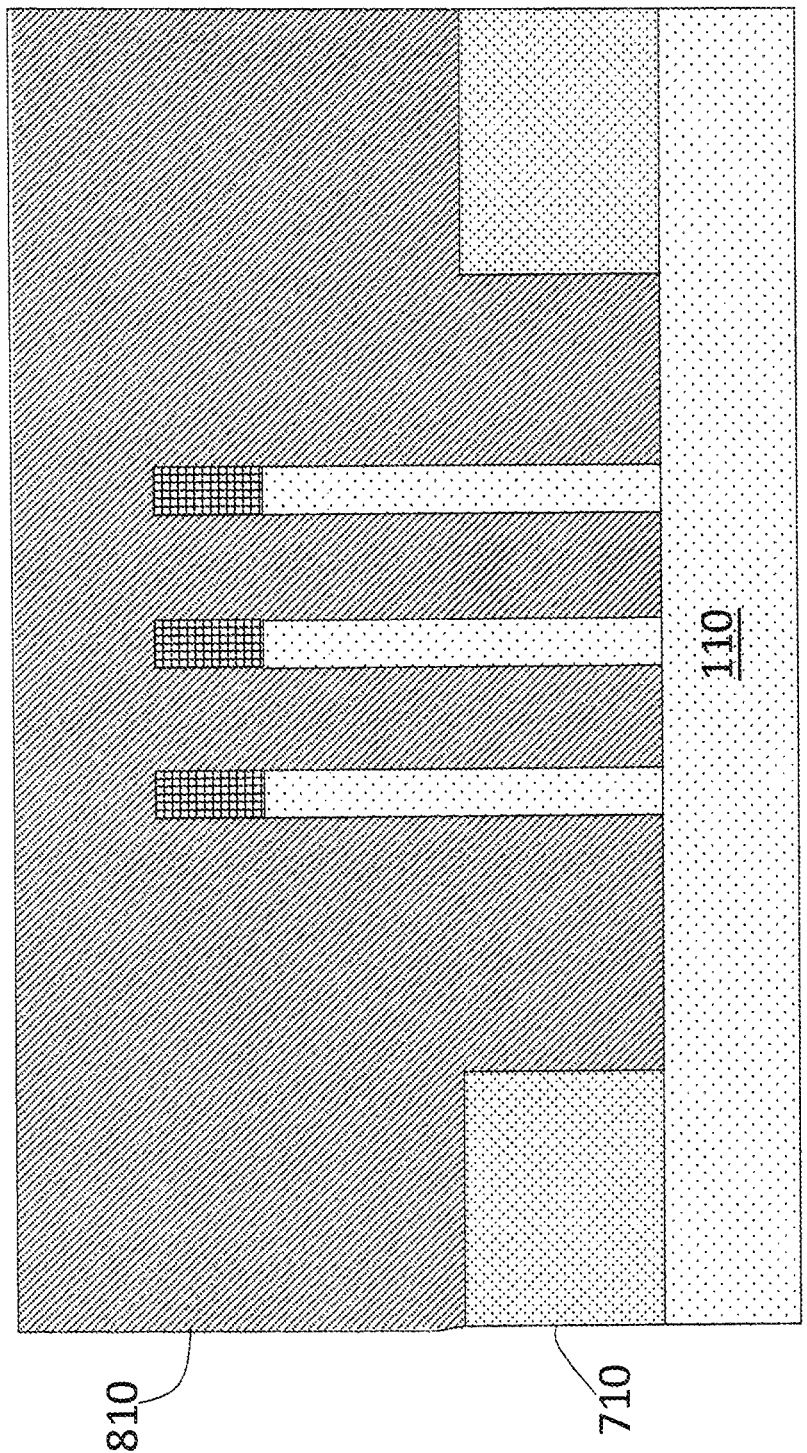

Deposition of the second insulating material 810 in the trench 1210 results in the intermediate structure shown in FIG. 14. As FIG. 14 indicates, the second insulating material 810 deposited in the fin region 520 is not separated from the substrate 110 by any of the first insulating material 710. This is in contrast to the embodiment shown in FIG. 10 in which the second insulating material 810 deposited in the trench 910 is separated from the substrate 110 by a layer of the first insulating material 710. After deposition, the second insulating material 810 is planarized by a CMP process, for example.

Figure 15:
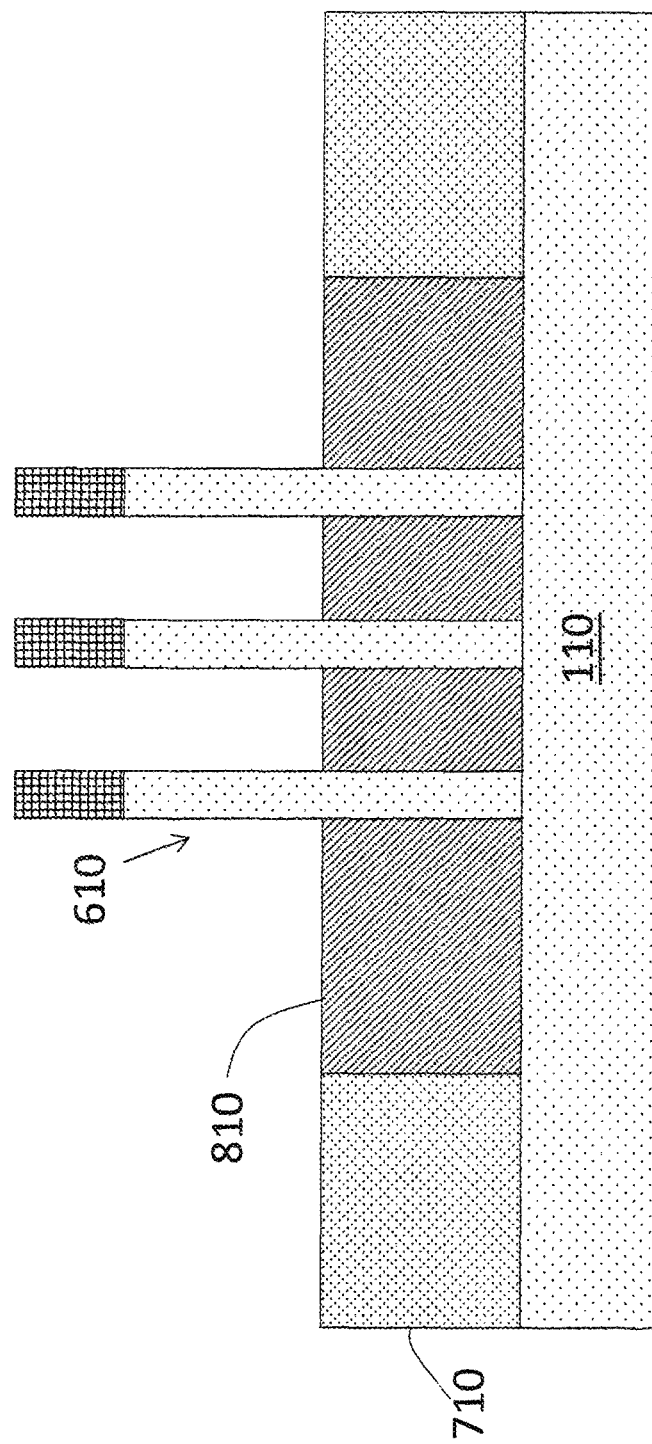
Figure 16:
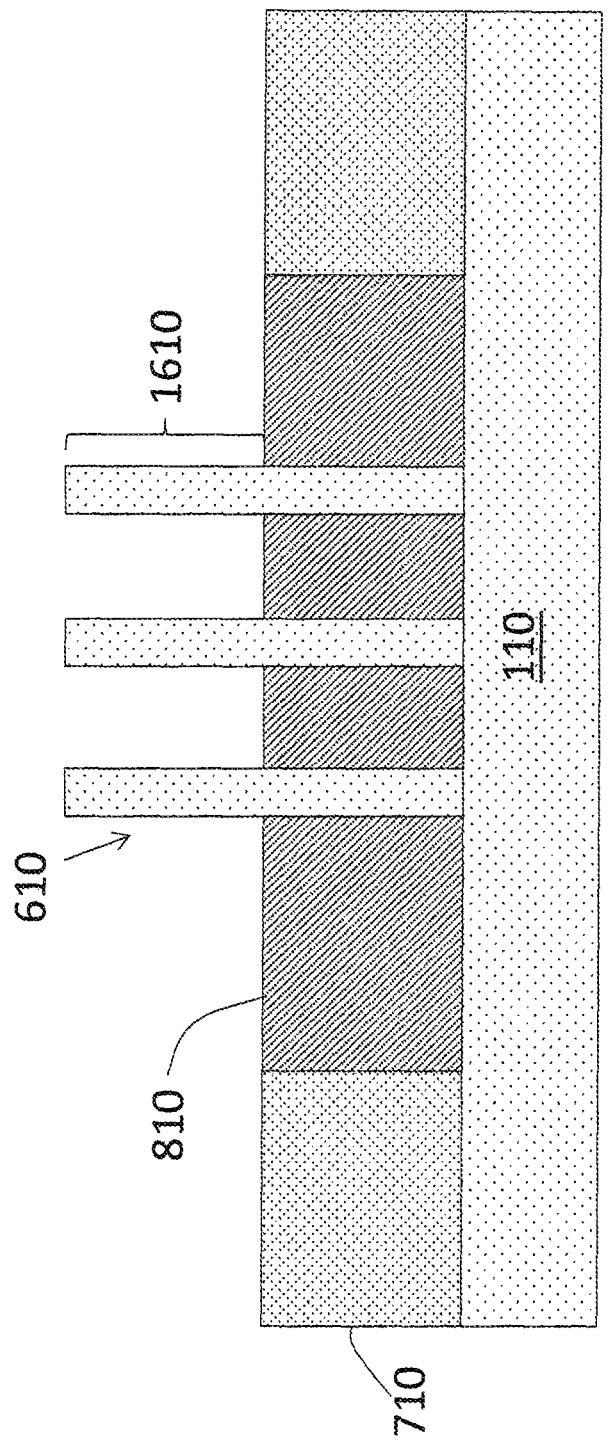

FIG. 15 shows the intermediate structure that results from recessing the second insulating material 810. As previously noted with reference to FIG. 11, the height of the first insulating material 710 is used as an endpoint detection layer during the recessing of the second insulating material 810. By controlling the depth of the first insulating material 710 during the deposition, discussed with reference to FIG. 7, the height of the second insulating material 810 can be controlled. This, in turn, controls the channel height 1610 (FIG. 16). FIG. 16 shows a cross-sectional view of the intermediate structure that results from removing the hardmasks 120 above the fins 610. The channel height 1610 is indicated in FIG. 16.

Figure 17:
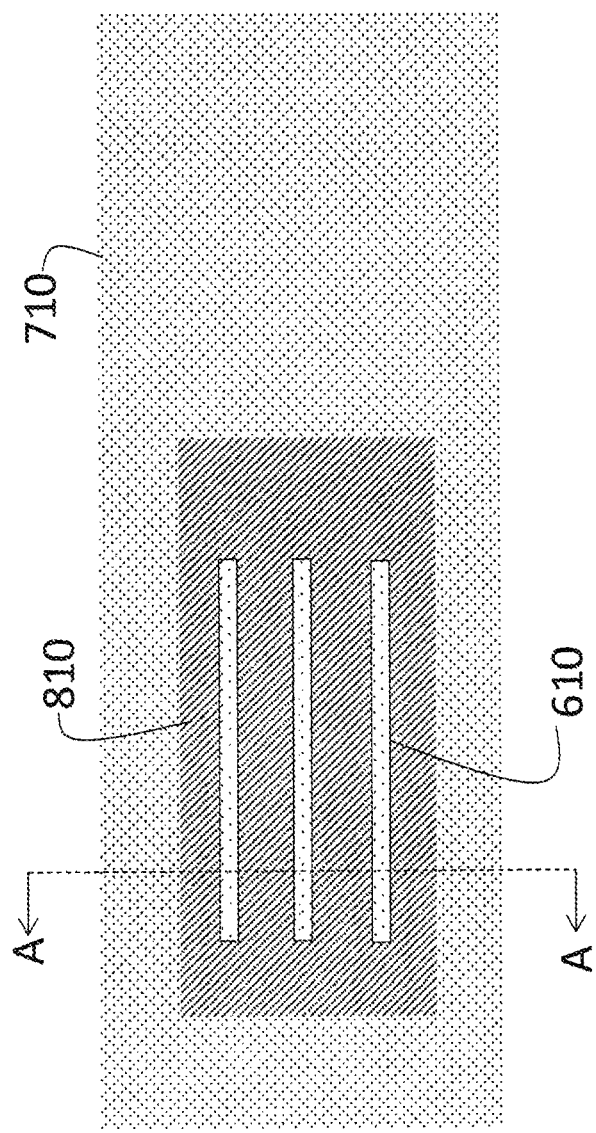
FIG. 17 is a top view of the intermediate structure shown in FIG. 12 or FIG. 16.

FIG. 17 is a top view of an intermediate structure that can be the structure shown in either FIG. 12 or FIG. 16. The fins 610 are formed with the second insulating material 810 surrounding them. The first insulating material 710 is in the non-fin regions 510. From the top view shown in FIG. 17, the depth of the second insulating material 810 is not discernable. That is, the second insulating material 810 can be separated from the substrate 110 by the first insulating material 710, as shown in FIG. 12, or first insulating material 710 can be absent between the second insulating material 810 and the substrate 110, as shown in FIG. 16. FIG. 17 also indicates the cross-sectional cut A-A, which is shown in FIGS. 1-16.

Figure 18:
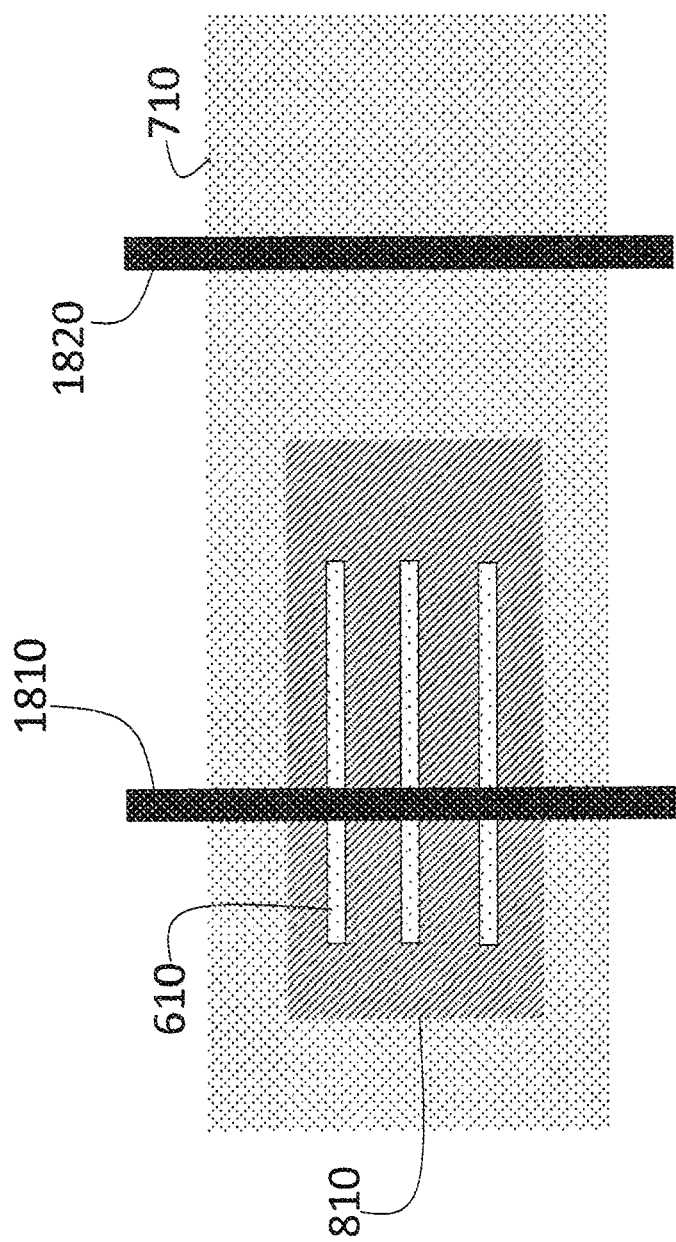
FIG. 18 is a top view of the intermediate structure that includes a gate formed in the fin region and a dummy gate formed in the non-fin region according to one or more embodiments.

FIG. 18 is a top view of an intermediate structure that includes a gate 1710 formed over the fins 610 and also a dummy gate 1820 formed in the non-fin region 510 on the first insulating material 710. According to one or more embodiments that involve the first insulating material 710 being a material other than an oxide (e.g., SiCO, SiBCN, SiN), the dummy gate 1820 is not susceptible to flop-over as it would be if it were formed on an oxide, which the second insulating material 810 typically can be. As previously noted, the dummy gate 1820, which is not supported by the fins 610 as the gate 1810 is, would be susceptible to flop-over if it were formed on an oxide. This is because HF, which is used in subsequent processing of the intermediate structure shown in FIG. 18, undercuts oxide. This issue is avoided according to the one or more embodiments described, because HF does not undercut the first insulating material 710 on which the dummy gate 1820 is now formed according to one or more embodiments in which the first insulating material 710 is not an oxide.

Various embodiments are described herein with reference to the related drawings. Alternative embodiments can be devised without departing from the scope of the described embodiments. It is noted that various connections and positional relationships (e.g., over, below, adjacent, etc.) are set forth between elements in the following description and in the drawings. These connections and/or positional relationships, unless specified otherwise, can be direct or indirect, and are not intended to be limiting in this respect. Accordingly, a coupling of entities can refer to either a direct or an indirect coupling, and a positional relationship between entities can be a direct or indirect positional relationship. As an example of an indirect positional relationship, references to forming layer "A" over layer "B" include situations in which one or more intermediate layers (e.g., layer "C") is between layer "A" and layer "B" as long as the relevant characteristics and functionalities of layer "A" and layer "B" are not substantially changed by the intermediate layer(s).

The terminology used herein is for the purpose of describing particular embodiments only and is not intended to be limiting of the invention. As used herein, the singular forms "a", "an" and "the" are intended to include the plural forms as well, unless the context clearly indicates otherwise.

The following definitions and abbreviations are to be used for the interpretation of the claims and the specification. As used herein, the terms "comprises," "comprising," "includes," "including," "has," "having," "contains" or "containing," or any other variation thereof, are intended to cover a non-exclusive inclusion. For example, a composition, a mixture, process, method, article, or apparatus that comprises a list of elements is not necessarily limited to only those elements but can include other elements not expressly listed or inherent to such composition, mixture, process, method, article, or apparatus. It will be further understood that the terms "comprises" and/or "comprising," when used in this specification, specify the presence of stated features, integers, steps, operations, elements, and/or components, but do not preclude the presence or addition of one or more other features, integers, steps, operations, element components, and/or groups thereof.

Additionally, the term "exemplary" is used herein to mean "serving as an example, instance or illustration." Any embodiment or design described herein as "exemplary" is not necessarily to be construed as preferred or advantageous over other embodiments or designs. The terms "at least one" and "one or more" are understood to include any integer number greater than or equal to one, i.e. one, two, three, four, etc. The terms "a plurality" are understood to include any integer number greater than or equal to two, i.e. two, three, four, five, etc. The term "connection" can include both an indirect "connection" and a direct "connection."

For the sake of brevity, conventional techniques related to semiconductor device and integrated circuit fabrication may or may not be described in detail herein. Moreover, the various tasks and process steps described herein can be incorporated into a more comprehensive procedure or process having additional steps or functionality not described in detail herein. In particular, various steps in the manufacture of semiconductor devices and semiconductor-based ICs are well known and so, in the interest of brevity, many conventional steps will only be mentioned briefly herein or will be omitted entirely without providing the well-known process details.

The corresponding structures, materials, acts, and equivalents of all means or step plus function elements in the claims below are intended to include any structure, material, or act for performing the function in combination with other claimed elements as specifically claimed. The description of the present invention has been presented for purposes of illustration and description, but is not intended to be exhaustive or limited to the invention in the form described. Many modifications and variations will be apparent to those of ordinary skill in the art without departing from the scope and spirit of the invention. The embodiment was chosen and described in order to best explain the principles of the invention and the practical application, and to enable others of ordinary skill in the art to understand the invention for various embodiments with various modifications as are suited to the particular use contemplated.

The flow diagrams depicted herein are just one example. There can be many variations to this diagram or the steps (or operations) described therein without departing from the spirit of the invention. For instance, the steps can be performed in a differing order or steps can be added, deleted or modified. All of these variations are considered a part of the claimed invention.

While the preferred embodiment to the invention had been described, it will be understood that those skilled in the art, both now and in the future, can make various improvements and enhancements which fall within the scope of the claims which follow. These claims should be construed to maintain the proper protection for the invention first described.

The descriptions of the various embodiments of the present invention have been presented for purposes of illustration, but are not intended to be exhaustive or limited to the embodiments described. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments described herein.

What is claimed is:

1. A fin field effect transistor (finFET), comprising:
   one or more fins configured to form a channel region above a substrate;
   a first insulating material formed in non-channel regions adjacent to the channel region; and
   a second insulating material, different than the first insulating material, formed in the channel region directly below the one or more fins, wherein the second insulating material is adjacent to the first insulating material and above the first insulating material, with the second insulating material being formed directly above a portion of the first insulating material in the channel region.

2. The finFET according to claim 1, wherein the second insulating material is separated from the substrate by the layer of the first insulating material.

3. The finFET according to claim 1, wherein a top surface of the second insulating material in the channel region is a same height as the first insulating material in the non-channel region.

4. The finFET according to claim 1, wherein a thickness of the second insulating material in the channel region is less than a thickness of the first insulating material in the non-channel region.

5. The finFET according to claim 1, wherein the second insulating material is an oxide.

6. The finFET according to claim 5, wherein the first insulating material is silicon carbon oxygen (SiCO).

7. The finFET according to claim 5, wherein the first insulating material is silicon boron carbide nitride (SiBCN).

8. The finFET according to claim 5, wherein the first insulating material is silicon nitride (SiN).

9. The finFET according to claim 1, wherein the first insulating material is an oxide.

10. The finFET according to claim 9, wherein the second insulating material is a non-oxide.

11. The finFET according to claim 1, wherein a channel height is defined by a thickness of the first insulating material and the second insulating material in the channel region.

12. The finFET according to claim 1, further comprising a gate formed in the channel region.

13. The finFET according to claim 1, further comprising a dummy gate formed in the non-channel region.

* * * * *